United States Patent [19]
Harvey

[11] Patent Number: 4,937,053
[45] Date of Patent: Jun. 26, 1990

[54] CRYSTAL GROWING APPARATUS

[75] Inventor: David S. Harvey, Groton, Mass.

[73] Assignee: Mobil Solar Energy Corporation, Billerica, Mass.

[21] Appl. No.: 257,766

[22] Filed: Sep. 30, 1988

Related U.S. Application Data

[63] Continuation of Ser. No. 31,392, Mar. 27, 1987, abandoned.

[51] Int. Cl.⁵ .................................... C30B 15/34
[52] U.S. Cl. .................... 422/249; 422/246;
156/608; 156/617.1; 156/619.1; 156/636.4;
136/DIG. 83; 136/DIG. 88; 136/DIG. 89;
136/DIG. 64; 118/401
[58] Field of Search .............. 422/246, 249; 156/608,
156/617.1, 619.1, 629.4, DIG. 64, DIG. 53,
DIG. 88, DIG. 89; 118/401

[56] References Cited

U.S. PATENT DOCUMENTS

| | | | |
|---|---|---|---|
| 3,265,469 | 8/1966 | Hall | 156/DIG. 83 |
| 3,701,636 | 10/1972 | LaBelle et al. | 156/DIG. 88 |
| 3,846,082 | 11/1974 | LaBelle et al. | 422/246 |
| 3,953,174 | 4/1976 | LaBelle | 156/DIG. 88 |
| 4,118,197 | 10/1978 | MacKintosh et al. | 422/246 |
| 4,230,674 | 10/1980 | Taylor et al. | 422/246 |
| 4,415,401 | 11/1983 | Wald et al. | 156/608 |
| 4,440,728 | 4/1984 | Sterment et al. | 422/246 |
| 4,443,411 | 4/1984 | Kalejs | 422/246 |
| 4,544,528 | 10/1985 | Sterment et al. | 422/246 |
| 4,647,437 | 3/1987 | Sterment et al. | 422/246 |

Primary Examiner—John Doll
Assistant Examiner—Robert M. Kunemund
Attorney, Agent, or Firm—Schiller, Pandiscio & Kusmer

[57] ABSTRACT

An apparatus and process are disclosed for growing tubular crystalline bodies according to the Edge defined, Film-Fed Growth (EPG) process, wherein the apparatus has at least one exterior passage (240) and at least oen interior passage (245) formed in its crucible die assembly (200) and associated parts, whereby gases introduced into at least one exterior passage (725) will be delivered to the zone located outside the growing crystalline body (900) (i.e. the "exterior" zone ) adjacent to the growth face on the die member (215), and gases introduced into at least one interior passage (720) will be delivered to the zone located inside of the hollow crystalline body (i.e. the "interior" zone) adjacent to the growth face on the die member, whereby the atmosphere in each of the zones may be separately controlled.

26 Claims, 3 Drawing Sheets

CRYSTAL GROWING APPARATUS

This application is a continuation of application Ser. No. 07/031,392, filed Mar. 27, 1987, now abandoned.

FIELD OF THE INVENTION

This invention relates to crystal growing apparatus in general, and more particularly to apparatus adapted to grow crystalline bodies according to the EFG ("Edge-defined, Film-fed Growth") process.

BACKGROUND OF THE INVENTION

Various methods have been developed for growing crystalline bodies from a melt. One such method is known as the EFG ("Edge-defined, Film-fed Growth") process. Details of the EFG process and of apparatus for growing crystalline bodies according to the EFG process are described and illustrated in U.S. Pat. No. 3,591,348 issued Jul. 6, 1971 to Harold E. La Belle, Jr. for "Method of Growing Crystalline Materials", and in U.S. Pat. No. 3,687,633 issued aug. 29, 1972 to Harold E. La Belle, Jr. et al. for "Apparatus for Growing Crystalline Bodies from the Melt".

In the EFG process, a capillary-forming die member is placed in association with a melt of liquid source material so that a growth face on the die member is wetted with a liquid film of source material from the melt by capillary action. A product crystalline body is then grown by first introducing a seed crystal to the liquid film of source material so that crystal formation is initiated, and then drawing the seed crystal away from the growth face at a controlled rate so that the liquid film of source material remains sandwiched between the growing crystalline body and the growth face of the die member. Since the liquid film of source material on the die's growth face is continuously replenished from the melt by the die's one or more capillaries, continuous crystalline bodies of significant size may be grown from the melt.

One consequence of the EFG process described above is that the cross-sectional shape of the product crystalline body is determined by the shape of the growth face of the die member. As a result, by appropriately shaping the growth face of the die member, crystalline bodies may be grown which have the shape of a round rod (i.e., where the crystalline body has a cross-sectional shape which is that of a solid circle), a flat ribbon (i.e., where the crystalline body has a cross-sectional shape which is that of a solid rectangle), a hollow tube (i.e., where the crystalline body has an annular cross-section of circular, elliptical or polygonal shape), etc.

The present invention is directed to apparatus adapted to grow tubular crystalline bodies according to the EFG process.

Existing apparatus for growing tubular crystalline bodies according to the EFG process is described and illustrated in U.S. Pat. No. 4,230,674 issued Oct. 8, 1980 to Aaron S. Taylor et al. for "Crucible-Die Assemblies For Growing Crystalline Bodies Of Selected Shapes", U.S. Pat. No. 4,440,728 issued Apr. 3, 1984 to Richard W. Stormont et al. for "Apparatus For Growing Tubular Crystalline Bodies", and U.S. Pat. No. 4,544,528 issued Oct. 1, 1985 to Richard W. Stormont et al. for "Apparatus For Growing Tubular Crystalline Bodies".

In practice, it has been found that significant improvements in crystal quality can be obtained if one can control the atmosphere surrounding the growing crystalline body. This is because control of the atmosphere surrounding the growing crystalline body allows harmful reactive gases to be removed from the area surrounding the growing crystalline body while allowing inert gases, beneficial reactive gases, and/or beneficial doping gases to be introduced to the area surrounding the growing crystalline body. In addition, control of the temperature of the atmosphere surrounding the growing crystalline body can facilitate proper regulation of the temperature of the growing crystalline body.

U.S. Pat. No. 4,415,401 issued Nov. 15, 1983 to Fritz Wald et al. for "Control Of Atmosphere Surrounding Crystal Growth Zone", U.S. Pat. No. 4,443,411 issued Apr. 17, 1984 to Juris P. Kalejs for "Apparatus For Controlling The Atmosphere Surrounding A Crystal Growth Zone", and the publication "Modeling Of Ambient-Meniscus Melt Interactions Associated With Carbon And Oxygen Transport In EFG Of Silicon Ribbon" by J. P. Kalejs and L. Y. Chin, published in the Journal Of The Electrochemical Society, Vol. 129, No. 6, June 1982, teach ways of controlling the atmosphere surrounding a growing crystalline body where that body is a flat ribbon. Unfortunately, these references are silent as to how to control the atmosphere surrounding the growing crystalline body where that body is in the form of a hollow tube. In this respect, it is noted that the problems of controlling the atmosphere surrounding the growing crystalline body are magnified significantly in the case of apparatus adapted to grow hollow tubes, since in such apparatus the body of the growing hollow tube serves to effectively divide the atmosphere surrounding the growing crystalline body into an "exterior" zone (i.e., the zone located outside the growing crystalline body) and an "interior" zone (i.e., the zone located inside the growing crystalline body), because the walls of the growing crystalline body serve to prohibit the direct flow of gases between the "exterior" and "interior" zones and gases can only flow between the two zones by passing through the seed holder located at the remote end of the hollow crystalline body.

OBJECTS OF THE INVENTION

As a result, one of the objects of the present invention is to provide novel apparatus for growing tubular crystalline bodies according to the EFG process wherein the apparatus includes means for controlling the atmosphere surrounding the growing crystalline body.

Another object of the present invention is to provide means for controlling the atmosphere surrounding the growing tubular crystalline body wherein the atmosphere in the zone located outside the growing crystalline body (i.e., the "exterior" zone) can be controlled independently of the atmosphere in the zone located inside the growing crystalline body (i.e., the "interior" zone).

SUMMARY OF THE INVENTION

These and other objects are achieved by providing novel apparatus for growing tubular crystalline bodies according to the EFG process wherein the apparatus has at least one exterior passage and at least one interior passage formed in its crucible-die assembly and associated parts, whereby gases introduced into the at least one exterior passage will be delivered to the zone located outside the growing crystalline body (i.e. the "exterior" zone) adjacent to the growth face on the die member, and gases introduced into the at least one interior passage will be delivered to the zone located inside of the hollow crystalline body (i.e., the "interior" zone) adjacent to the growth face on the die member, whereby the atmosphere in each of the zones may be separately controlled.

As used herein, the terms "tube" and "tubular" are to be construed in a generic sense to include elongate hollow bodies having a circular, polygonal or other— e.g. elliptical—cross-sectional shape.

BRIEF DESCRIPTION OF THE DRAWINGS

Still other objects and features of the present invention will be more fully disclosed or rendered obvious in the following detailed description of the invention, which is to be considered together with the accompanying drawings wherein like figures refer to like parts and further wherein.

DETAILED DESCRIPTION OF THE INVENTION

Figure 1:
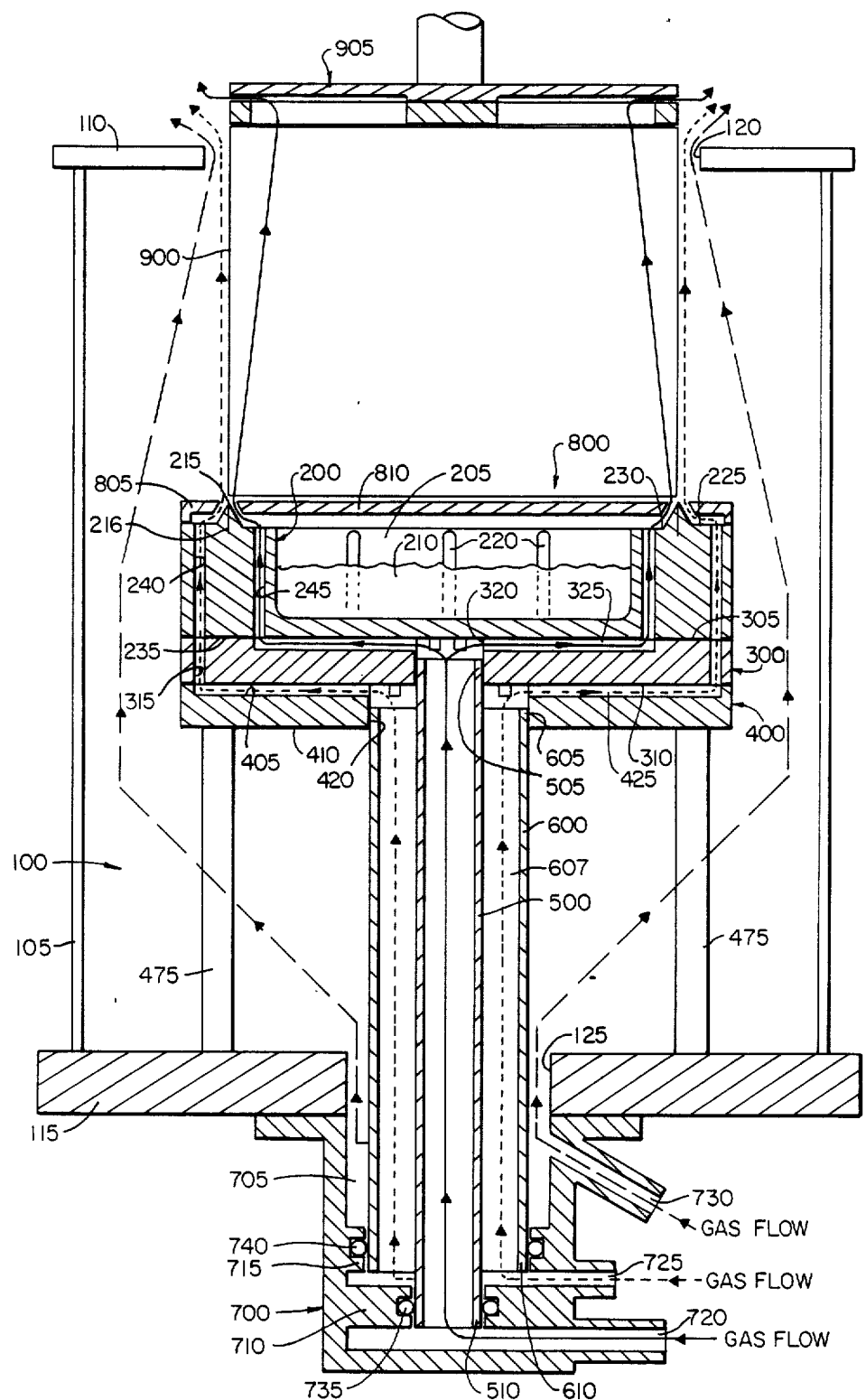
FIG. 1 is a sectional view of novel apparatus for growing tubular crystalline bodies according to the EFG process, wherein the apparatus incorporates a preferred embodiment of the present invention.

Looking first at FIG. 1, there is shown novel apparatus for growing tubular crystalline bodies from a melt. Although not shown, it is to be understood that the apparatus of FIG. 1 also includes associated apparatus such as heating coils, inner and outer after heater assemblies, insulation, etc. such as is normally found in a crystal growing furnace of the type disclosed in U.S. Pat. No. 4,440,728. Such associated apparatus has now been omitted to facilitate understanding of the present invention.

The apparatus of FIG. 1 comprises a growth chamber 100 defined by a side wall 105, a top cover 110 and a chamber base 115. Top cover 110 has a center hole 120 formed therein, and chamber base 115 has a center hole 125 formed therein. Aperture 120 is axially aligned with aperture 125 Top aperture 120 preferably has a shape which, when looked at in plan view, is identical to the cross-sectional shape of the hollow crystalline body which is being grown in the apparatus, so that the hollow crystalline body issuing from the melt can pass through aperture 120 and make a reasonably close fit with the inner edges of top cover 110 which define its aperture 120, as will hereinafter be described in further detail Center hole 125 preferably has a shape which, when looked at in plan view, is circular. The growth chamber's side wall 105, top cover 110 and chamber base 115 are fastened to one another so as to be as airtight as possible at their points of intersection, whereby center holes 120 and 125 constitute the portals into and out of growth chamber 100. Growth chamber 100 is formed out of those materials well known to those skilled in the art that are compatible with and do not react with the material of the hollow crystalline body that is being grown, e.g. side wall 105 is made of quartz, and top cover 110 and chamber base 115 are made of stainless steel where the growing crystalline body consists of silicon.

Figure 2:
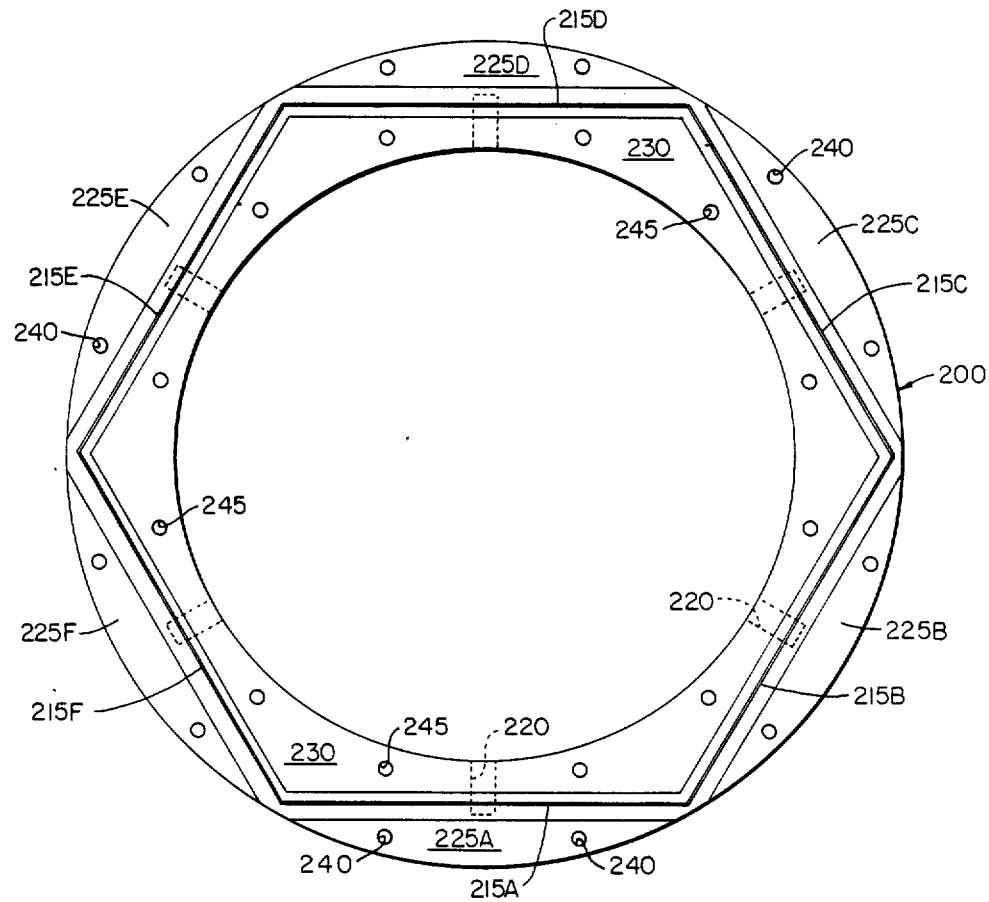
FIG. 2 is a top plan view of the crucible-die assembly shown in FIG. 1.

Crucible-die assembly 200 is disposed within growth chamber 100. Looking next at FIGS. 1, 2 and 2A, crucible-die assembly 200 is similar to crucible-die assemblies well known in the art, but differs therefrom in specific features that are hereinafter described and illustrated in detail. More specifically, crucible-die assembly 200 comprises a central chamber 205 for receiving a melt 210 of the source material which is to be grown, a growth face 215 formed at the top of the crucible-die assembly, a capillary 216 that intersects growth face 215, and a plurality of capillary feed slots 220 formed in the walls of the crucible-die assembly for wetting growth face 215 with a liquid film of source material from melt 210.

Figure 2A:
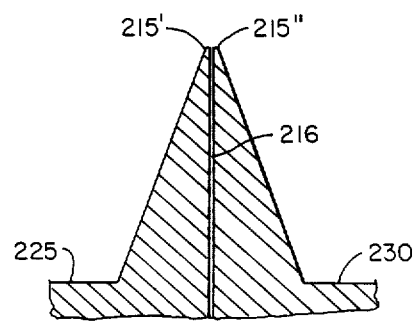
FIG. 2A is a partial sectional view of the crucible-die assembly shown in FIGS. 1 and 2.

Referring now to FIG. 2A, it is to be noted that growth face 215 actually comprises a pair of end surfaces or edges 215' and 215' separated by a capillary opening 216. It is to be understood that liquid source material (i.e., the "melt") is transported via feed slots 220 and capillary 216 to growth face 215 by capillary action.

Crucible-die assembly 200 has its growth face 215 formed as a series of six abutting surfaces 215A, 215B, 215C, etc. (see FIG. 2), whereby a hollow tubular crystal of a hexagonal nature will be grown. Crucible-die assembly 200 has a pair of top surfaces disposed on either side of, and slightly below, growth face 215: an exterior top surface 225 (actually formed by six co-planar surfaces 225A, 225B, 225C, etc.) resides alongside growth face 215 exterior to the growth face; and an interior top surface 230 resides alongside growth face 215 interior to the growth face. As best seen in FIG. 1, top surfaces 225 and 230 sit below growth face 215 but sit above the top surface of melt 210. Crucible-die assembly 200 also includes a flat bottom surface 235. Crucible-die assembly 200 is formed out of materials well known to those skilled in the art, e.g. graphite.

The foregoing features of crucible-die assembly 200 are all believed to be well known to those skilled in the art. Crucible-die assembly 200 departs from conventional crucible-die assemblies in that it includes a plurality of exterior vertical passages 240 which extend between the crucible-die assembly's exterior top surface 225 and its bottom surface 235, and a plurality of interior vertical passages 245 which extend between the crucible-die assembly's interior top surface 230 and its bottom surface 235.

Figure 3:
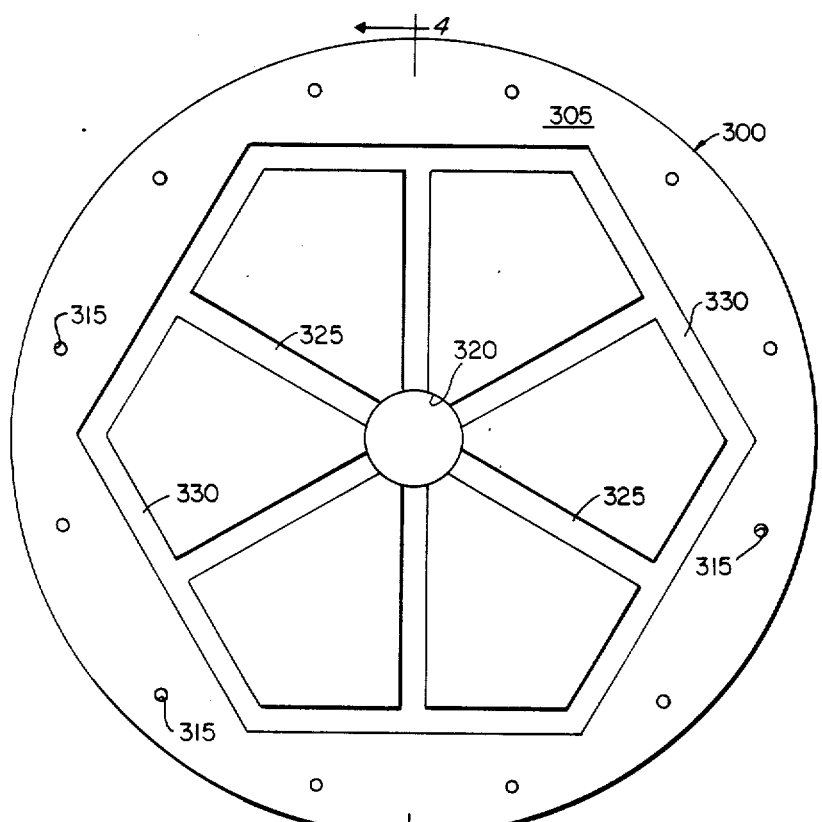
FIG. 3 is a top plan view of the interior gas flow manifold shown in FIG. 1.
Figure 4:
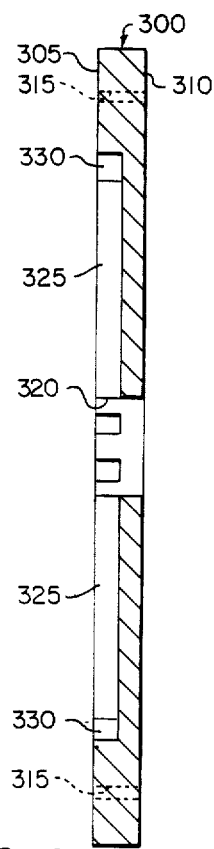
FIG. 4 is a sectional view taken along line 4—4 of FIG. 3.

Crucible-die assembly 200 sits on an interior gas manifold plate 300. Looking next at FIG. 1, 3 and 4, interior gas manifold plate 300 comprises a disk or platter which has a flat top surface 305 and a flat bottom surface 310. Interior gas manifold 300 has a plurality of vertical passages 315 which extend between its top surface 305 and its bottom surface 310. Vertical passages 315 are sized and positioned so that they may be aligned with exterior vertical passages 240 formed in crucible-die assembly 200 when interior gas manifold plate 300 is positioned against the bottom surface of the crucible-die assembly, as will hereinafter be described in further detail. Interior gas manifold plate 300 also includes a central aperture 320 which extends between the plate's top surface 305 and its bottom surface 310. A plurality of surface grooves 325 (FIG. 3) are formed in top surface 305 of plate 300. Surface grooves 325 communicate with the plate's central aperture 320 and radiate outwardly so as to communicate with a hexagonally-shaped surface groove 330 also formed in the plate's top surface 305. Hexagonal surface groove 330 is sized and positioned so that it may be aligned with interior vertical passages 245 formed in crucible-die assembly 200 when interior gas manifold plate 300 is positioned against the bottom surface of the crucible-die assembly, as will hereinafter be described in further detail. Interior gas manifold plate is formed out of materials well known to those skilled in the art, e.g. graphite.

Figure 5:
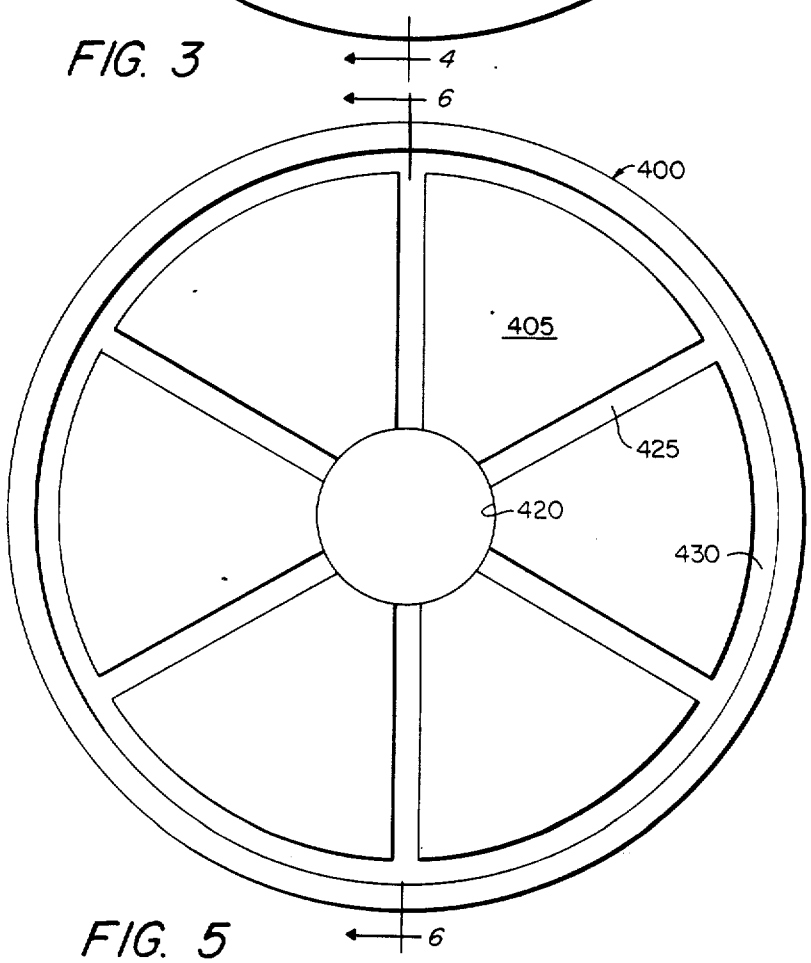
FIG. 5 is a top plan view of the exterior gas flow manifold shown in FIG. 1.
Figure 6:
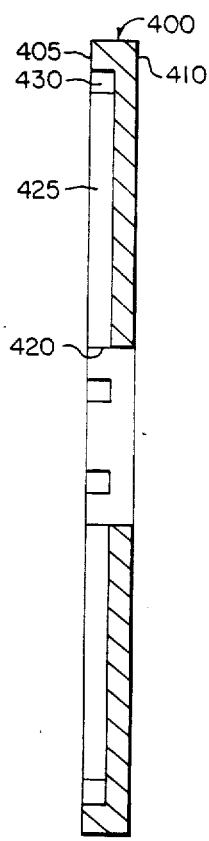
FIG. 6 is a sectional view taken along line 6—6 of FIG. 5.

Interior gas manifold plate 300 in turn sits atop an exterior gas manifold plate 400. Looking next at FIGS. 1, 5 and 6, exterior gas manifold plate 400 comprises a disk or platter having a flat top surface 405 and a flat bottom surface 410. Exterior gas manifold plate 400 has a central aperture 420 which extends between its top surface 405 and its bottom surface 410. A plurality of surface grooves 425 are formed in top surface 405 of plate 400. Surface grooves 425 communicate with the plate's central aperture 420 and radiate outwardly so as to communicate with a circular surface groove 430 (FIG. 5) also formed in the plate's top surface 405. Circular surface groove 430 is sized and positioned so that it may be aligned with vertical passages 315 formed in interior gas manifold plate 300 when exterior gas manifold plate 400 is positioned against the bottom surface of interior gas manifold plate 300, as will hereinafter be described in further detail. Exterior gas manifold plate 400 is formed out of materials well known to those skilled in the art, e.g. graphite.

Crucible-die assembly 200, interior gas manifold plate 300 and exterior gas manifold plate 400 are assembled together in the manner shown in FIG. 1, so that top surface 305 of interior gas manifold plate 300 is positioned against bottom surface 235 of crucible-die assembly 200, with vertical passages 315 of the interior gas manifold plate being aligned with exterior vertical passages 240 of the crucible-die assembly, and with surface grooves 325 of the interior gas manifold plate adjoining bottom surface 235 of the crucible-die assembly whereby bottom surface 235 forms a ceiling for surface grooves 325, and with surface grooves 325 of the interior gas manifold plate communicating with interior vertical passages 245 formed in the crucible-die assembly In addition to the foregoing, top surface 405 of exterior gas manifold plate 400 is positioned against bottom surface 310 of interior gas manifold plate 300 so that central aperture 420 of the exterior gas manifold plate is axially aligned with central aperture 320 of interior gas manifold plate, and so that surface grooves 425 of the exterior gas manifold plate adjoin bottom surface 310 of the interior gas manifold plate whereby bottom surface 310 forms a ceiling for surface grooves 425, and so that surface grooves 425 of the exterior gas manifold plate communicate with vertical passages 315 formed in the interior gas manifold plate. As seen in FIG. 1, crucible-die assembly 200, interior gas manifold plate 300 and exterior gas manifold plate 400 are supported within growth chamber 100 by a plurality of posts 475 which extend between chamber base 115 and exterior gas manifold plate 400.

Still looking at FIG. 1, an interior gas feed tube 500 is attached to interior gas manifold plate 300 so that the feed tube's top end 505 forms an airtight fit with the walls of the manifold which define that manifold's central aperture 320. Interior gas feed tube 500 is attached to interior gas manifold plate 300 in the manner shown in FIG. 1 so that the feed tube's interior communicates with radial surface grooves 325 formed in interior manifold plate 300, whereby gases passed into the feed tube's lower end 510 will flow first into surface grooves 325 formed in the interior gas manifold plate and thereafter into internal vertical passages 245 formed in crucible-die assembly 200. Interior gas feed tube 500 is formed out of materials well known to those skilled in the art, e.g. graphite.

An exterior gas feed tube 600 is positioned concentrically around interior gas feed tube 500 and attached to exterior gas manifold plate 400 so that the exterior gas feed tube's top end 605 forms an airtight fit with the walls of the manifold which define that manifold's central aperture 420. This arrangement results in the creation of a chamber 607 between the concentric walls of the interior and exterior gas feed tubes. Exterior gas feed tube 600 is attached to exterior gas manifold plate 400 in the manner shown in FIG. 1 so that the aforementioned interior chamber 607 communicates with radial surface grooves 425 formed in exterior gas manifold plate 400, whereby gases passed into the feed tube's lower end 610 will flow first into surface grooves 425 formed in the exterior gas manifold plate, through vertical passages 315 formed into interior gas manifold plate 300, and thereafter into exterior vertical passages 240 formed in crucible-die assembly 200. Exterior gas feed tube 600 is formed out of materials well known to those skilled in the art, e.g. graphite.

Still looking at FIG. 1, the bottom ends of interior gas feed tube 500 and exterior gas feed tube 600 extend downward through bottom central aperture 125 formed in chamber base 115 and contact a gas fitting 700. Gas fitting 700 is disposed about bottom central aperture 125 and forms an airtight fit with chamber base 115. Gas fitting 700 is equipped with a central aperture 705, a first interior wall 710, a second interior wall 715, a first port 720, a second port 725 and a third port 730. Interior gas feed tube 500 is attached to gas fitting 700 so that the tube's second end 510 forms an airtight fit with an O-ring seal 735 disposed in a groove in first wall 710, whereby gases entering the fitting's first port 720 will be directed into the interior of interior gas feed tube 500. Exterior gas feed tube 600 is attached to gas fitting 700 so that the tube's second end 610 forms an airtight fit with an O-ring seal 740 disposed in a groove in second wall 715, whereby gases entering the fitting's second port 725 will be directed into the chamber 607 formed between the concentric interior and exterior gas feed tubes. On account of the fact that the outside dimension of exterior gas feed tube 600 is sized to be less than the dimension of bottom central aperture 125 of chamber base 115 and also less than the width of the gas fitting's central aperture 705, gases entering the fitting's third port 730 will be directed into the interior of growth chamber 100 but will be kept exterior to exterior gas feed tube 600 and crucible-die assembly 200. Gas fitting 700 is formed out of materials well known to those skilled in the art, e.g. stainless steel.

Still looking at FIG. 1, the novel apparatus for growing tubular crystalline bodies from a melt also includes gas directing means 800 disposed about the top end of crucible-die assembly 200. More specifically, gas directing means 800 comprises an exterior gas deflector 805 which sits atop the crucible-die assembly's exterior top surface 225 and which directs gases exiting from the top of exterior vertical passages 240 toward the crucible-die assembly's growth face 215, and an interior gas deflector 810 which sits atop the crucible-die assembly's interior top surface 230 and which directs gases exiting from the top of interior vertical passages 245 toward the crucible-die assembly's growth face 215. Exterior gas deflector 805 and interior gas deflector 810 are formed out of materials well known to those skilled in the art, e.g. graphite.

On account of the foregoing construction, when a hollow crystalline body 900 is being grown from a melt 210 according to the EFG process in ways well known in the art, gases directed into first port 720 of gas fitting 700 will make their way along the interior of interior gas feed tube 500, along surface grooves 325 formed in interior gas manifold plate 300, into interior vertical passages 245 formed in crucible-die assembly 200 and thereafter be deflected by interior gas deflector 810 against the interior surface of the hollow crystalline body issuing from die growth face 215. At the same time, gases directed into second port 725 of gas fitting 700 will make their way along chamber 607 formed between the concentric gas feed tubes 500 and 600, along surface grooves 425 formed in exterior gas manifold plate 400, into vertical passages 315 formed in interior gas manifold plate 300, along exterior vertical passages 240 formed in crucible-die assembly 200 and thereafter be deflected by exterior gas deflector 805 against the exterior surface of the hollow crystalline body issuing from die growth face 215. Finally, gases directed into third port 730 of gas fitting 700 will make their way through bottom central aperture 125 formed in chamber base 115 and into growth chamber 100.

It is to be appreciated that since top central aperture 120 of the growth chamber's top cover 110 is sized so as to be slightly larger than the crystalline body issuing from the melt, gases introduced into growth chamber 100 via the gas fitting's second port 725 and third port 730 will be able to escape from the growth chamber by passing through the small gap existing between the issuing crystalline body 900 and top cover 110. It is also to be appreciated that inasmuch as the seed holder 905 set at the top of the issuing hollow crystalline body 900 is not airtight, gases introduced into the interior of the growing crystalline body 900 via first port 720 will be able to escape from the interior of the issuing hollow crystalline body by passing through seed holder 905.

By way of example, suppose a hexagonal silicon tube of 8 inch diameter is to be grown at a rate of 1 inch per minute using the aforementioned apparatus, and the inert gas argon is to be introduced into growth chamber 100 via ports 720, 725 and 730 so as to purge the growth zone of any harmful reactive gases which might be present. In this case, port 720 might be used to introduce argon into the zone located inside the growing crystalline body (i.e., the "interior" zone), where the argon is introduced at a temperature of approximately 30 degrees C. and is introduced at a rate of approximately 12000 cubic centimeters per minute; port 725 might be used to introduce argon into the zone located outside the growing crystalline body (i.e., the "exterior" zone), where the argon is introduced at a temperature of approximately 30 degrees C. and is introduced at a rate of approximately 12000 cubic centimeters per minute; and port 730 might be used to introduce argon into growth chamber 100, where the gas is introduced at a temperature of approximately 30 degrees C. and is introduced at a rate of approximately 16000 cubic centimeters per minute. The temperature of the growth face of the die is maintained at a temperature of between about 1410 and 1450 degrees C. during the growth procedure. The tubular crystalline product has a wall thickness of about 0.4 millimeters and its composition essentially comprises silicon.

While in the foregoing example inert argon gas was described as being introduced into ports 720 and 725 for the purpose of purging the growth zone of any harmful reactive gases which might be present, and inert argon gas was described as being introduced into port 730 for the purpose of providing an inert atmosphere within growth chamber 100, beneficial reactive gases such as oxygen, carbon monoxide, carbon dioxide, methane, etc. might be introduced into one or both of the ports 720 and 725 so as to introduce them into the growth zone, or port 730 so as to introduce them into growth chamber 100, or beneficial doping gases such as boron fluoride, phosphine, etc. might be introduced into one or both of the ports 720 and 725 so as to introduce them into the growth zone, or port 730 so as to introduce them into growth chamber 100.

It is, of course, possible to modify the apparatus described above without departing from the scope of the present invention. Thus, for example, crucible-die assembly 200 could be formed so as to have more or less than the six abutting die surfaces 215A, 215B, 215C, etc. and the six co-planar exterior surfaces 225A, 225B, 225C, etc. described above, whereby a crystalline body of a different cross-sectional shape could be grown, e.g. crucible-die assembly 200 could be formed so as to have nine abutting die surfaces 215A, 215B, 215C, etc. and nine co-planar surfaces 225A, 225B, 225C, etc., whereby crystalline bodies of a nonagonal cross-section could be grown.

In the apparatus describe above, the vertical passages 240 and 245 carrying the gases inlet at ports 720 and 725, respectively, extend through the full height of the crucible-die assembly 200 before opening on faces 225 and 230. Such an arrangement is generally desirable since it allows the gases moving through passages 240 and 245 to pick up the heat of the melt and facilitates deploying the gases at the growth zone at the same temperature as the melt. However, in certain circumstances one might wish to deploy the gases at a temperature different than that of the melt. In this case one might place a layer of insulation around passages 240 and 245 to insulate the gases flowing through these passages from the temperature of the melt or, alternatively, one might even alter the positioning of passages 240 and 245 so that they extend horizontally through the crucible-die assembly, parallel to surfaces 225 and 230; such an arrangement could reduce the exposure of the gases passing through these passages from the heat of the crucible, although it would necessitate replacing the present means used to transport the gases from inlet ports 720 and 725 to passages 240 and 245 with some alternate means.

Still other changes of this sort will be obvious to those skilled in the art and are considered to be within the scope of the present invention.

ADVANTAGES OF THE INVENTION

One of the advantages of using the present invention is that the novel apparatus for growing tubular crystalline bodies includes means for controlling the atmosphere surrounding the growing crystalline body. As a result, harmful reactive gases can be removed from the area surrounding the growing crystalline body and inert gases, beneficial reactive gases and/or beneficial doping gases can be introduced to the area surrounding the growing crystalline body. In addition, by controlling the temperature of the atmosphere surrounding the growing crystalline body, proper regulation of the temperature of the growing crystalline body can be facilitated.

Another advantage of using the present invention is that means are provided for controlling the atmosphere surrounding the growing tubular crystalline body wherein the atmosphere in the zone located outside the growing crystalline body (i.e., the "exterior" zone) can be controlled independently of the atmosphere in the zone located inside the growing crystalline body (i.e., the "interior" zone). As a result, the exterior of the product crystalline body can be subjected to different growth conditions than the interior of the product crystalline body, if desired.

Another advantage of the present invention is that inasmuch as exterior vertical passages 240 and interior vertical passages 245 pass through the full height of the crucible-die assembly prior to opening adjacent to the crucible-die assembly's growth face, gases flowing upward through these passages to the growth face are allowed an opportunity to reach temperatures very close to that of the melt.

Still other advantages of the present invention will be obvious to those skilled in the art.

What is claimed is:

1. Apparatus for use in a system for growing hollow crystalline bodies of a selected cross-sectional shape, said apparatus comprising:
   (a) a crucible-die assembly, said crucible-die assembly having means defining a crucible for containing a supply of liquid source material, means defining a growth face for supporting a liquid film of source material for contact by a seed crystal for use in crystal growth, and means defining at least one capillary for supplying liquid source material from said crucible to said growth face so as to sustain said liquid film of source material by capillary action, said growth face having an annular configuration characterized by an interior edge and an exterior edge, whereby a hollow tubular body may be grown from a liquid film of said source material on said growth face;
   (b) support means for supporting said crucible-die assembly;
   (c) first port means associated with said support means for defining a first gas inlet port; and
   (d) first passage means connected to said first port means for directing gases introduced into said first port means to the region adjacent said interior edge or said exterior edge of said growth face, at least part of said first passage means forming part of said crucible.

2. Apparatus according to claim 1 wherein said crucible has a side wall and at least part of said first passage means is formed in said side wall.

3. Apparatus according to claim 1 wherein said crucible-die assembly comprises an interior top surface adjacent to but separate from said interior edge, an exterior top surface adjacent to but separate from said exterior edge, and a bottom surface, and further wherein said first passage means comprises at least one passage extending between said interior top surface and said bottom surface or said exterior top surface and said bottom surface.

4. Apparatus according to claim 1 wherein said first passage means is arranged so as to direct gases introduced ia said first port means to the region adjacent said interior edge of said growth face; and further including
   second port means for defining a second gas inlet port; and
   second passage means connected to said second port means for directing gases introduced via said second port means to the region adjacent said exterior edge of said growth face, whereby inner and outer surfaces of a hollow body being grown from each liquid film will be contacted by gases discharged from said first and second passage means respectively, at least part of said second passage means being formed in at least part of said crucible.

5. Apparatus according to claim 4 wherein said first passage means is formed separate from and does not communicate with said second passage means.

6. Apparatus according to claim 4 wherein said crucible has a side wall and said first and second passage means have gas discharge openings in the upper end of said side wall adjacent to said growth face.

7. Apparatus according to claim 4 wherein said crucible-die assembly comprises an interior top surface adjacent to but separate from said interior edge, an exterior top surface adjacent to but separate from said exterior edge, and a bottom surface, and further wherein said first passage means comprises at least one passage extending between said interior top surface and said bottom surface and said second passage means comprises at least one passage extending between said exterior top surface and said bottom surface.

8. A crucible-die assembly for use in growing a hollow crystalline body of a selected cross-sectional shape, said crucible-die assembly comprising:
   a side wall and a bottom wall defining a chamber for containing a supply of liquid source material, said side wall having a top end and a bottom end, and said bottom wall being integral with the bottom end of said side wall;
   a raised die growth face at the top end of said side wall for supporting a liquid film of source material, said growth face defining an annular configuration characterized by an interior edge and an exterior edge, whereby a hollow tubular body may be grown onto a seed from a liquid film of said source material on said growth face;
   at least one capillary in said side wall for transporting liquid source material from said said chamber to said growth face by capillary action;
   means defining a gas inlet port spaced from said crucible-die assembly; and
   at least one passageway in said side wall connected to said gas inlet port for conveying one or more gases introduced into said gas inlet port, said at least one passageway having a discharge point at the top end of said side wall located so as to discharge said one or more gases upwardly along one of said interior and exterior edges of said growth face.

9. A crucible-die assembly according to claim 8 having a plurality of said passageways, and further wherein each of said passageways is connected to said gas inlet port by a tubular member extending downward from aid crucible-die assembly.

10. A crucible-die assembly according to claim 9 wherein said discharge point is located so as to discharge gases adjacent the interior edge of said growth face; and further including:

a second gas inlet port;

at least one other passageway in said side wall connected to said second gas inlet port for conveying one or more gases introduced into said second gas inlet port, said at least one other passageway having a discharge point at the top end of said side wall located so as to discharge said gases upwardly along said exterior edge of said growth face.

11. A crucible-die assembly according to claim 10 having a plurality of first passageways for discharging said one or more gases adjacent to the interior edge of said growth face, and a plurality of second passageways for discharging said one or more gases adjacent to said exterior edge of said growth face, and further wherein said first passageways are formed separate from and do not communicate with said second passageways.

12. Apparatus for sue in a system for growing a hollow crystalline body of a selected cross-sectional shape, said apparatus comprising:

(a) a crucible-die assembly, said crucible-die assembly comprising first and second wall means defining a crucible for containing a supply of liquid source material, means defining a die at the upper end of said first wall means for supporting a liquid film of source material for contact by a seed for crystal growth, and means defining at least one capillary in said first wall means for supplying liquid source material from said crucible to said die so as to sustain said liquid film of source material by capillary action, said die having an annular polygonal configuration characterized by an interior edge surface and an exterior edge surface, whereby a hollow crystalline body with a polygonal cross-sectional configuration may be grown from a liquid film of said source material on said die;

(b) means supporting said crucible-die assembly;

(c) first port means exterior of said crucible for defining a first gas inlet port remote from said crucible-die assembly;

(d) second port means exterior of said crucible for defining a second gas inlet port remote from said crucible-die assembly;

(e) third port means exterior of said crucible for defining a third gas inlet port remote from said crucible-die assembly;

(f) at least one first passageway in said first wall means having a first gas discharge port at one end located adjacent said interior edge surface of said die;

(g) first conduit means connecting the opposite end of said at least one first passageway to said first port means so that gas introduced via said first port will flow out of said first gas discharge port upwardly past he interior edge surface of said die;

(h) at least one second passageway in said first wall means having a second gas discharge port at one end located adjacent the exterior edge surface of said die;

(i) second conduit means connecting the opposite end of said at least one second passageway to said second port means so that a gas introduced via said second port will flow out of said second gas discharge port upwardly past the exterior edge surface of said die;

(j) third conduit means connected to said third port means for delivering a gas introduced via said third port means to the space surrounding said crucible-die assembly and the growing hollow body.

13. Apparatus according to claim 12 comprising an interior gas manifold means connected to said at least one passageway, an exterior gas manifold means connected to said at least one second passageway, and means connecting said interior and exterior gas manifold means to said first and second port means respectively.

14. Apparatus according to claim 12 comprising chamber-defining means defining a chamber surrounding said crucible-die assembly, and further wherein said chamber-defining means includes a an opening above said crucible-die assembly through which said growing hollow body is withdrawn.

15. Apparatus according to claim 12 comprising chamber-defining means defining a chamber surrounding said crucible-die assembly, and further wherein said third port means is connected to said chamber by said third conduit means.

16. Apparatus according to claim 14 further including first and second concentric gas deflectors overlying said crucible-die assembly, said deflectors being adjacent to but spaced from said interior and exterior edge surfaces respectively of said die, whereby to causes gases discharged from said first and second gas discharge ports to flow upwardly along and in contact with said inner and outer edge surfaces and the interior and exterior surfaces respectively of the growing crystalline body.

17. Apparatus for use in a system for growing a hollow crystalline body of a selected cross-sectional shape, said apparatus comprising:

(a) a support base;

(b) a crucible-die assembly supported on said base, said crucible-die assembly comprising means defining a crucible for containing a supply of liquid source material, means defining a die face for supporting a liquid film of source material for contact by a seed crystal for use in crystal growth, and means defining at least one capillary for supplying liquid source material from said crucible to said die face so as to sustain said liquid film of source material by capillary action, said die face having an annular configuration characterized by an interior edge and an exterior edge, whereby a hollow crystalline body may be grown from a liquid film on said die face;

(c) means defining a chamber surrounding said crucible-die assembly;

(d) means connected to said support base defining first, second and third port means exterior of said crucible-die assembly;

(e) first passage means for delivering one or more gases introduced into said first port means to said crucible-die assembly adjacent said interior edge of said die face;

(f) second passage means for delivering one or more gases introduced into said second port means to said crucible-die assembly adjacent said exterior edge of said die face;

(g) third passage means for delivering gases introduced into said third port means into one end of said chamber surrounding the crucible-die assembly and the growing hollow body; and (h) means for discharging gases from the opposite end of said chamber.

18. Apparatus according to claim 17 comprising an exterior gas manifold means supported by said support base, an interior gas manifold means supported by said exterior gas manifold means and supporting said crucible-die assembly, means connecting said interior gas manifold means between said first port means and said first passage means, and means connecting said exterior gas manifold means between said second port means and said second passage means.

19. Apparatus for growing a hollow crystalline body from a liquid supply of a source material that is solid at room temperature and becomes a liquid when melted, said apparatus comprising:

(a) a furnace defining a chamber;

(b) a crucible-die assembly disposed within said chamber, said crucible-die assembly comprising a crucible for containing a supply of liquid source material, said crucible having a bottom wall and a side wall, means defining a die at the upper end of said side wall for supporting a liquid film of source material for contact by a seed for crystal growth, at least one capillary passageway in said side wall leading from said crucible to said die for supplying liquid source material to said die from said crucible by capillary action, so as to sustain said liquid film of source material, said die having an annular configuration characterized by an interior edge and an exterior edge, whereby a hollow body with an annular cross-sectional configuration may be grown from said liquid film of source material supported on said die;

(c) means supporting aid crucible-die assembly in said furnace chamber;

(d) first port means exterior of said furnace chamber defining a first gas inlet port remote from said crucible-die assembly;

(e) second port means exterior of said furnace chamber defining a second gas inlet port remote from said crucible-die assembly;

(f) third port means exterior of said furnace chamber defining a third gas inlet port remote from said crucible-die assembly;

(g) a plurality of first gas passageways in said side wall, with each of said first gas passageways having a gas discharge port at one end located immediately adjacent said interior edge of said die;

(h) first conduit means connecting the opposite ends or said first gas passageways to said first gas inlet port so that gas introduced via said first gas inlet port will flow out of the gas discharge ports of said first gas passageways upwardly past the interior edge of said die face;

(i) a plurality of second gas passageways in said side wall, with each of said second gas passageways having a gas discharge port at one end located immediately adjacent the exterior edge of said die face;

(j) second conduit means connecting the opposite ends of said second gas passageways to said second gas inlet port so that a gas introduced via said second gas inlet port will flow out of the discharge ports of said second gas passageways upwardly pas the exterior edge of said die face; and (k) means connected to said third gas inlet port for delivering a gas introduced via said third gas inlet port into said furnace chamber, whereby gas introduced via said third gas inlet port will flow through the space surrounding said crucible-die assembly and the growing hollow body.

20. Apparatus according to claim 19 wherein said gas discharge ports of said first and second gas passageways are located below the topmost portion of said die, said opposite ends of said first and second gas passageways are located below said one end of said first and second gas passageways, and said first and second conduit means extend downwardly from said gas passageways.

21. Apparatus according to claim 20 wherein aid crucible is supported by manifold means, and said manifold means provide separate fluid connections between said first and second gas passageways and said first and second conduit means respectively.

22. Apparatus according to claim 21 wherein said first and second conduit means comprise first and second concentric tubes.

23. Apparatus according to claim 19 wherein said first and second conduit means comprise first and second concentric tubes each having a first end and a second end, and further wherein said first ends are connected to aid first and second gas passageways respectively within said furnace chamber and said second ends are connected to said said first and second gas inlet ports respectively outside of said furnace assembly.

24. Apparatus according to claim 19 wherein said die is characterized by a polygonal configuration at its interior and exterior edges.

25. Apparatus according to claim 19 wherein said die has a hexagonal or nonagonal configuration at its interior and exterior edges.

26. Apparatus according to claim 19 wherein said first and second gas passageways are uniformly spaced about the enter axis of said die.

* * * * *

UNITED STATES PATENT AND TRADEMARK OFFICE
CERTIFICATE OF CORRECTION

PATENT NO. : 4,937,053
DATED : June 26, 1990
INVENTOR(S) : David S. Harvey It is certified that error appears in the above-identified patent and that said Letters Patent is hereby corrected as shown below:

Claim 8, column 10, line 49, cancel "said" (second occurrence);

Claim 9, column 10, line 64, change "aid" to -- said --;

Claim 19, column 13, line 29, change "aid" to -- said --; and

Claim 26, column 14, line 49, change "enter" to -- center --.

Signed and Sealed this

Sixteenth Day of June, 1992

*Attest:*

DOUGLAS B. COMER

*Attesting Officer*   Acting Commissioner of Patents and Trademarks